United States Patent
Scheiper et al.

(10) Patent No.: US 8,709,902 B2
(45) Date of Patent: Apr. 29, 2014

(54) SACRIFICIAL SPACER APPROACH FOR DIFFERENTIAL SOURCE/DRAIN IMPLANTATION SPACERS IN TRANSISTORS COMPRISING A HIGH-K METAL GATE ELECTRODE STRUCTURE

(75) Inventors: Thilo Scheiper, Dresden (DE); Kerstin Ruttloff, Hainichen (DE); Maciej Wiatr, Dresden (DE); Stefan Flachowsky, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 342 days.

(21) Appl. No.: 13/192,567

(22) Filed: Jul. 28, 2011

(65) Prior Publication Data
US 2012/0156837 A1 Jun. 21, 2012

(30) Foreign Application Priority Data
Dec. 16, 2010 (DE) .................. 10 2010 063 293

(51) Int. Cl.
*H01L 21/336* (2006.01)
*H01L 21/8238* (2006.01)
(52) U.S. Cl.
CPC *H01L 21/823814* (2013.01); *H01L 21/823864* (2013.01)
USPC ............ 438/305; 438/216; 438/287; 438/306
(58) Field of Classification Search
USPC ................... 438/305, 216, 287, 306
See application file for complete search history.

(56) References Cited

U.S. PATENT DOCUMENTS

| | | | | |
|---|---|---|---|---|
| 6,319,799 | B1 * | 11/2001 | Ouyang et al. | 438/528 |
| 7,759,233 | B2 * | 7/2010 | Forbes | 438/585 |
| 2007/0020866 | A1 | 1/2007 | Cheng | 438/301 |
| 2007/0034906 | A1 | 2/2007 | Wang et al. | 257/224 |
| 2007/0275532 | A1 | 11/2007 | Chidambarrao et al. | 438/300 |

FOREIGN PATENT DOCUMENTS

EP 1 202 341 A1 5/2002 .......... H01L 21/8238

OTHER PUBLICATIONS

Translation of Official Communication from German Patent Office for German Patent Application No. 10 2010 063 293.7 dated Aug. 11, 2011.

* cited by examiner

*Primary Examiner* — Stephen W Smoot
*Assistant Examiner* — Vicki B Booker
(74) *Attorney, Agent, or Firm* — Amerson Law Firm, PLLC

(57) ABSTRACT

In complex semiconductor devices, the profiling of the deep drain and source regions may be accomplished individually for N-channel transistors and P-channel transistors without requiring any additional process steps by using a sacrificial spacer element as an etch mask and as an implantation mask for incorporating the drain and source dopant species for deep drain and source areas for one type of transistor. On the other hand, the usual main spacer may be used for the incorporation of the deep drain and source regions of the other type of transistor.

24 Claims, 3 Drawing Sheets

SACRIFICIAL SPACER APPROACH FOR DIFFERENTIAL SOURCE/DRAIN IMPLANTATION SPACERS IN TRANSISTORS COMPRISING A HIGH-K METAL GATE ELECTRODE STRUCTURE

BACKGROUND OF THE INVENTION

1. Field of the Invention

Generally, the present disclosure relates to the fabrication of highly sophisticated integrated circuits including transistor elements that comprise a high-k metal gate electrode structure formed in an early process stage.

2. Description of the Related Art

The fabrication of advanced integrated circuits, such as CPUs, storage devices, ASICs (application specific integrated circuits) and the like, requires a very high number of circuit elements to be formed on a given chip area according to a specified circuit layout, wherein field effect transistors represent one important type of circuit element that substantially determines performance of the integrated circuits. Currently, a plurality of process technologies are practiced, wherein, for many types of complex circuitry including field effect transistors, CMOS technology is one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, the distance between the source and drain regions, which is also referred to as channel length.

A significant gain in performance of advanced semiconductor devices has been achieved by continuously reducing the lateral dimensions of the individual circuit elements, such as the field effect transistors. To this end, the gate electrode is generally a very critical circuit feature of the field effect transistor, which basically determines the overall transistor characteristics and also the drive current capability. For example, switching speed and current drive capability of the channel may be increased by reducing the channel length and/or by increasing the charge carrier mobility in the channel region, which may be accomplished, in most recent developments, by inducing a certain type of strain in the channel region. On the other hand, the approach of reducing the channel length has been followed over the last decades, thereby resulting in a channel length of less than 50 nm in most recent field effect transistors used in sophisticated circuits, such as CPUs and the like. Consequently, the length of the gate electrode structures of similar dimensions requires very sophisticated patterning strategies, wherein typically, in view of superior alignment of the gate electrode structure and the channel region, the gate electrode structure is formed prior to performing any implantation processes for introducing the dopant species for the drain and source regions. Upon further reducing the overall dimensions of complex transistor elements, it turns out that very sophisticated dopant profiles are required in the vicinity of the channel region in order to provide superior conductivity of the drain and source regions, while at the same time appropriately configuring the electrical field distribution in the vicinity of the channel region. Moreover, the overall dopant concentration at and within the channel region also significantly determines transistor specific characteristics, such as threshold voltage, i.e., the voltage at which a conductive channel forms in the channel region, so that corresponding complex implantation sequences have to be performed for N-channel transistors and P-channel transistors, respectively, while using the respective gate electrode structures as efficient implantation masks. For example, in sophisticated field effect transistors, typically so-called drain and source extension regions, i.e., extremely shallow doped regions with a moderately high dopant concentration, have to be provided which may connect to the channel region, thereby substantially defining the effective channel length of the transistor. On the other hand, underlying drain and source areas have to be provided with a reduced lateral offset from the channel region, however, with high dopant concentration and with a depth that may also significantly influence the overall transistor characteristics. Moreover, complex counter-doped areas may have to be provided in the remaining body region of the transistor, thereby obtaining PN junctions with increased dopant concentration gradients, which may result in superior transistor performance. Such counter-doped regions, i.e., counter-doped with respect to the drain and source doping, may also be referred to as halo regions and typically require complex tilting implantation process techniques in order to position the counter-dopants below the gate electrode structure at an appropriate depth within the active region.

Due to the complex implantation process sequence for implementing the drain and source dopant species and the counter-doping species, the lateral masking effect of the gate electrode structure may have to be appropriately adapted, for instance, with respect to the drain and source extension regions and halo regions, to the deep drain and source areas and the like, which may be accomplished by providing an appropriate spacer structure having a different lateral width at the various manufacturing stages. That is, for incorporating the drain and source extension dopant species, which have to be positioned laterally adjacent to the channel region, a spacer structure or spacer element with reduced width is to be used, while incorporating the dopant species for the deeper drain and source areas, a spacer structure of increased width has to be applied. Typically, spacer elements are provided by depositing an appropriate material, such as silicon nitride, by using conformal deposition techniques followed by an appropriate etch process, typically performed as anisotropic plasma-based etch processes, thereby preserving a portion of the previously deposited spacer layer at the sidewalls of the gate electrode structures, which may thus act in combination with the gate electrode structure as an efficient implantation mask. Typically, also any etch stop liners, such as a silicon dioxide material, may be used in combination with the actual spacer material in order to provide superior conditions and thus controllability of the process of forming sidewall spacers. Upon further reducing the overall dimensions of the transistors, the spacer structures may have to be adapted to the required lateral and vertical dopant profiles of the drain and source regions, thereby also requiring superior controllability of any process strategies for forming the spacer structure.

It turns out, however, that any patterning-related non-uniformities, which may be induced in the gate electrode structure during the complex patterning process, and also any process non-uniformities upon depositing and patterning a spacer material may increasingly affect the transistor characteristics when, for instance, the gate length is continuously reduced. For example, a variation in width of a spacer structure of several nanometers may not unduly affect the characteristics of a transistor having a gate length of 100 nm and more. On the other hand, a variance of the spacer width in this order of magnitude may have a significant influence on the finally obtained lateral and vertical dopant profile in transistors having a gate length of 50 nm and significantly less, thereby also inducing a corresponding variability in the finally achieved transistor characteristics. Furthermore, due to the complex patterning process for forming gate electrode structures in the corresponding spacer elements, typically the process flow is designed such that gate electrode structures and corresponding spacers are provided commonly for P-channel transistors and N-channel transistors, wherein the selective incorporation of the appropriate dopant species is accomplished by using appropriate masking regimes on the basis of resist masks formed by lithography techniques. Thus, upon incorporating a P-type dopant species for a P-channel transistor, the corresponding N-channel transistors may be masked, while the implantation parameters may be specifically selected so as to take into consideration the desired vertical and lateral dopant profile for the P-channel transistor, wherein also the masking effect of the gate electrode structure and the spacer structure is taken account of. Thereafter, a corresponding mask is provided so as to cover the P-channel transistors and appropriate implantation parameters are selected for achieving the desired transistor characteristics of the N-channel transistors.

It turns out that, although basically the gate electrode structures of the P-channel transistors and the N-channel transistors may have experienced the same process flow, small variations may be introduced, for instance with respect to spacer width, which may thus affect the further processing, for instance in terms of incorporating appropriate dopant species. For example, in sophisticated patterning strategies, it has been observed that, for instance, the spacer width of P-channel transistors may be less compared to the spacer width of N-channel transistors, which may, however, require a corresponding initial design of the spacer structures such that a required minimum spacer width is provided for the P-channel transistors, since here typically boron is used as the dopant species which exhibits a pronounced diffusion activity compared to N-type dopant species, such as arsenic and the like. Consequently, for a given transistor architecture and a specific thermal budget during the anneal processes for activating the dopant species, the spacer width has to ensure a required minimum offset from the channel region or the gate electrode structure in view of the incorporation of the boron species. In this case, the spacer width of the gate electrode structures of the N-channel transistors may further be increased, which on the other hand may also result in a reduced exposed area for incorporating the N-type dopant species in transistor areas in which closely spaced gate electrode structures have to be provided. In this case, for example, the gate electrode structures of closely spaced N-channel transistors may have a reduced lateral offset or spacing between the corresponding spacer structures, thereby also reducing the surface area that is available for incorporating the N-type dopant species, which may result in a reduced dose, thereby also affecting the finally obtained transistor characteristics. For example, the reduced dose incorporated during the complex implantation process may result in a reduced or missing dopant concentration at the bottom of active regions, which may specifically influence the transistor characteristics in a silicon-on-insulator (SOI) architecture in which the parasitic capacitance of the PN junctions may significantly depend on the fact that deep drain and source areas may have to connect to the buried insulating material layer.

As discussed above, performance of sophisticated transistors may not only be increased by reducing the gate length, but also other mechanisms may be implemented, for instance in view of increasing the charge carrier mobility and/or improving the electronic characteristics of the gate electrode structure for a given geometric configuration thereof. For example, with respect to the former aspect, frequently strain-inducing mechanisms may be implemented into the overall process flow for forming sophisticated transistors, wherein one very promising approach is the incorporation of a strain-inducing silicon/germanium material into the drain and source areas of the P-channel transistors. The silicon/germanium alloy may typically be formed on the basis of appropriate selective epitaxial growth processes, thereby achieving a highly strained state, which in turn may result in a compressive strain, which may increase the hole mobility. The silicon/germanium material is typically incorporated after patterning the basic gate electrode structure by forming respective cavities in the active region and refilling the cavities with the silicon/germanium material.

The latter aspect for enhancing transistor performance by improving the electronic characteristics of the gate electrode structure may be realized by using superior dielectric material, which provides a desired high capacitive coupling while not unduly increasing the gate leakage currents. To this end, so-called high-k dielectric material may be incorporated into the gate insulation layers, wherein a high-k dielectric material is to be understood as a dielectric material having a dielectric constant of 10.0 or higher. Moreover, in these approaches, typically a metal-containing electrode material may be incorporated in the vicinity of the gate dielectric material in order to avoid the presence of the typically used polysilicon material, since this material typically forms depletion zones upon operating the transistor device.

Consequently, in any of these sophisticated process strategies, generally the complexity of the gate patterning process and any subsequent processes may have an influence on the further processing and thus on the finally obtained sidewall spacer structures, which in turn may result in a certain variability of the drain and source regions formed by implantation processes, as is also discussed above. For example, generally the process of incorporating a strain-inducing semiconductor alloy in the drain and source regions of one of the transistors may result in a sophisticated device topography, which in turn may affect the subsequent lithography processes and patterning processes, which in turn may result in small differences of the resulting gate electrode structures. Similarly, the patterning process of the gate electrode structures may be a complex sequence of lithography and etch steps, wherein typically sacrificial material systems may have to be provided, such as hard mask materials, in order to form the gate electrode structures with the desired gate length and gate width. To this end, frequently a material layer or layer system, for instance mainly comprised of silicon nitride, may be used, wherein this material may further be maintained, for instance throughout the fabrication process for providing the strain-inducing semiconductor alloy in one of the transistors so that this dielectric cap material or hard mask material may experience different process conditions in different transistor types. Moreover, this cap material has to be removed during the further processing of the semiconductor device, which is also typically accomplished by providing a sacrificial spacer structure, which may allow the removal of the dielectric cap layer, however, without unduly affecting any remaining components of the gate electrode structures, such as the very sensitive high-k dielectric materials and any metal-containing electrode materials, which are reliably confined by an appropriate sidewall spacer structure, which, however, would unduly be affected by the cap removal process.

As is evident from the above description, the process of patterning gate electrode structures and the corresponding spacer structures may involve a plurality of very complex interrelated process steps so that, for instance, the individual provision of spacer elements for N-channel transistors and P-channel transistors may additionally increase the overall complexity of the patterning process. On the other hand, spacer width variability, for instance between N-channel transistors and P-channel transistors, may significantly affect the overall transistor characteristics, in particular in sophisticated semiconductor devices in which additional performance enhancing mechanisms are implemented.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides semiconductor devices and manufacturing techniques in which the masking effect of gate electrode structures of different types of transistors may be adjusted individually for each type of transistor without contributing additional process complexity to the overall process flow. In this manner, the deep drain and source areas of sophisticated P-channel transistors may be formed on the basis of an appropriately selected spacer width for given desired process parameters, for instance for any anneal processes in which typically a certain degree of dopant diffusion may occur upon activating the dopant species. On the other hand, the specifically selected spacer width for one type of transistor may not unduly affect the implantation sequence for forming at least the deep drain and source regions for the other type of transistors, which may be accomplished by using a spacer structure which may, at least partially, be used for the removal of a dielectric cap material and which may thus be available for incorporating the deep source and drain areas since the spacer width of this spacer structure may be appropriately adapted to the requirements of the implantation process without affecting its function during the removal of the dielectric cap material. Thus, by appropriately positioning the implantation process for forming deep drain and source areas for one type of transistor on the basis of a protective spacer structure that is also used for removing the dielectric cap material, an individual adjustment of the spacer width and thus of the implantation conditions for the deep drain and source areas, N-channel transistors and P-channel transistors may be achieved without increasing the overall process complexity.

One illustrative method disclosed herein comprises forming a first gate electrode structure above a first active region and a second gate electrode structure above a second active region, wherein the first and second gate electrode structures comprise a dielectric cap layer. The method further comprises forming a sacrificial spacer on sidewalls of the first and second gate electrode structures. Furthermore, the dielectric cap layer is removed in the presence of the sacrificial spacer. The method further comprises forming deep drain and source regions selectively in the first active region by using the sacrificial spacer as an implantation mask. Moreover, the sacrificial spacer is removed from the first and second gate electrode structures. Additionally, the method comprises forming deep drain and source regions selectively in the second active region after the removal of the sacrificial spacer.

A further illustrative method disclosed herein relates to forming transistors of a semiconductor device. The method comprises forming a first gate electrode structure on a first active region and forming a second gate electrode structure on a second active region, wherein the first and/or the second gate electrode structures comprise a gate dielectric layer including a high-k dielectric material. The method further comprises forming a sacrificial spacer on sidewalls of the first and second gate electrode structures. Furthermore, deep drain and source regions are formed selectively in the first active region by using the sacrificial spacer as an implantation mask. Furthermore, the sacrificial spacer is removed from the first and second gate electrode structures. Additionally, the method comprises forming second deep drain and source regions selectively in the second active region by using a spacer element formed on sidewalls of the first and second gate electrode structures after the removal of the sacrificial spacer.

A still further illustrative method disclosed herein relates to forming a semiconductor device. The method comprises forming a first gate electrode structure above a first active region and a second gate electrode structure above a second active region, wherein the first and second gate electrode structures comprise a high-k dielectric material and a dielectric cap layer. The method further comprises forming a first spacer structure on sidewalls of the first and second gate electrode structures and removing the dielectric cap layer from the first and second gate electrode structures by using the first spacer structure as an etch mask. The method further comprises forming first deep drain and source regions in the first active region in the presence of the first spacer structure. Additionally, the method comprises forming second deep drain and source regions in the second active region by using a second spacer structure.

BRIEF DESCRIPTION OF THE DRAWINGS

The disclosure may be understood by reference to the following description taken in conjunction with the accompanying drawings, in which like reference numerals identify like elements, and in which.

Figure 1A:
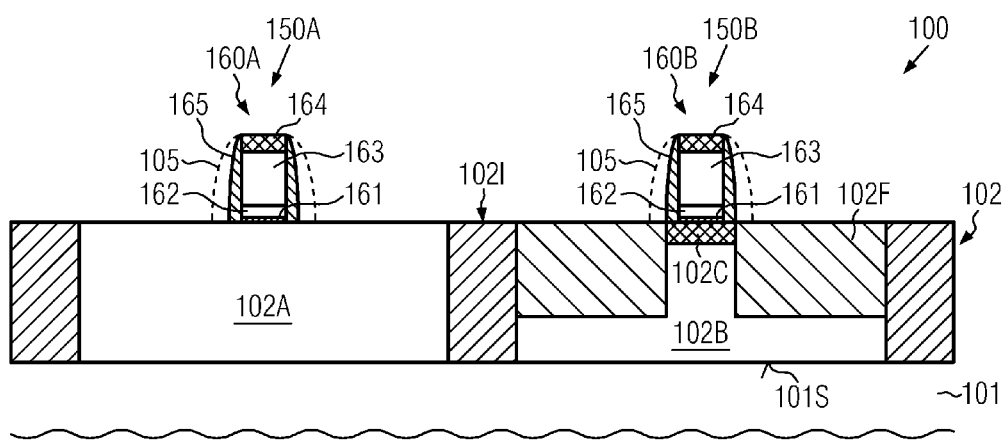
FIGS. 1a-1h schematically illustrate cross-sectional views of a semiconductor device during various manufacturing stages in forming sophisticated transistor elements with superior deep drain and source dopant profiles obtained on the basis of two different spacer structures, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally contemplates manufacturing techniques and semiconductor devices in which the variability of transistor characteristics, and in particular transistor variabilities caused by the profile of the drain and source regions, may be reduced by forming at least the deep drain and source areas of P-channel transistors and N-channel transistors on the basis of a spacer structure of specifically adapted spacer width. In this manner, any imbalance in the spacer width between N-channel transistors and P-channel transistors may be taken into consideration without negatively affecting the desired critical and lateral dopant profiles in the corresponding drain and source regions. Furthermore, any well-established process parameters, for instance with respect to the activation of the dopant species based on sophisticated anneal processes, may still be used without any restrictions with respect to inferior dopant profiles caused by a variation in spacer width of P-channel transistors and N-channel transistors. For example, as previously discussed, frequently in sophisticated manufacturing strategies for providing N-channel transistors and P-channel transistors, for instance based on additional performance enhancing mechanisms, a non-desired reduction of the spacer width of P-channel transistors may be compensated for by appropriately increasing the initial spacer width for incorporating the dopant species for the deep drain and source region, while on the other hand the increased spacer width may not negatively affect the drain and source implantation profile in the N-channel transistors, since at least the deep drain and source regions thereof may have been incorporated on the basis of a spacer structure having a reduced width, for instance based on a sacrificial spacer structure and the like.

In some illustrative embodiments disclosed herein, the individual adjustment of the spacer width with respect to the type of transistor under consideration may be accomplished without requiring any additional process steps, such as any additional processes for forming spacer elements, additional lithography steps and the like. To this end, a spacer structure may be used as an implantation mask for one type of transistor and may thus be provided with an appropriate spacer width, wherein the spacer structure may also be used for removing a sacrificial material, such as a dielectric cap layer, wherein an appropriate adaptation of the spacer width may not affect the function of the spacer as an appropriate etch mask. On the other hand, the other transistor type which may require a different spacer width may be formed by removing the sacrificial spacer and implementing a further spacer structure having the appropriate spacer width so as to comply with the requirements of this type of transistor. In other cases, the spacer structure used for removing the dielectric cap material may receive, after using the spacer structure as an implantation mask for one type of transistor, a further spacer element so as to adjust the final spacer width required for the other type of transistor. Also in this case, additional process steps may be avoided compared to conventional strategies in which at least one spacer structure may be used as a protective spacer structure or as an etch mask for removing the dielectric cap material.

FIG. 1a schematically illustrates a cross-sectional view of a semiconductor device 100 which may comprise a substrate 101 in combination with a semiconductor layer 102, which may be divided into several semiconductor regions or active regions 102A, 102B by appropriately dimensioned isolation regions 102I, provided for instance in the form of a shallow trench isolation. Moreover, in some illustrative embodiments, the active regions 102A, 102B may be provided in the form of an SOI architecture in which a buried insulating material (not shown) may connect to the active regions 102A, 102B, thereby forming an interface 101S, which may thus represent an insulating area in the "vertical" direction. It should be appreciated that an active region is to be understood as a region in and above which one or more transistors are to be provided. For example, in the embodiment shown, the active region 102A may be used to form a first transistor 150A, such as an N-channel transistor, while the active region 102B may be used to provide a complementary transistor, such as a transistor 150B in the form of a P-channel transistor. It should be appreciated, however, that the transistors 150A, 150B may represent any different type of transistor in which a different adaptation of at least deep drain and source regions may be advantageous in view of reducing transistor variabilities. In the manufacturing stage shown, the active region 102A may represent basically a semiconductor material of homogeneous composition, except for any well implantation species, which may define the basic electronic characteristics of the active region 102A. The active region 102B may, in some illustrative embodiments, comprise an additional performance enhancing mechanism, for instance in the form of a strained or strain-inducing semiconductor material 102F, which in some illustrative embodiments may be provided in the form of a silicon/germanium alloy, as is also discussed above. Furthermore, in some illustrative embodiments, the active region 102B may further comprise, at least at a portion thereof, a threshold adjusting semiconductor material 102C, such as a silicon/germanium material, which may be required for appropriately adapting the band gap with respect to a gate electrode structure 160B in order to obtain a desired threshold voltage of the transistor 150B. For example, the gate electrode structure 160B may represent a sophisticated high-k metal gate electrode structure, wherein an appropriate work function of the gate electrode structure 160B in combination with the electronic characteristics of the threshold adjusting semiconductor material 102C may result in the desired threshold voltage for the transistor 150B. It should be appreciated, however, that, in other illustrative embodiments, the active regions 102A, 102B may have a similar configuration, except for any differences required for adjusting the basic transistor characteristics.

Moreover, as shown, the gate electrode structure 160B may comprise a gate dielectric material 161, which may comprise any appropriate dielectric material, such as a conventional gate dielectric material in the form of silicon oxide, silicon oxynitride and the like, while in other cases the gate dielectric material 161 may comprise a high-k dielectric material, such as hafnium oxide and the like, in order to enhance the overall electronic characteristics of the gate electrode structure 160B. In some embodiments, a metal-containing electrode material 162 may be formed above the gate dielectric material 161 and may have any appropriate configuration so as to impart a desired work function to the gate electrode structure 160B, possibly in combination with any work function species contained in the layer 162 and/or the layer 161. Moreover, a further electrode material 163, typically provided in the form of amorphous or polycrystalline silicon, may be provided in combination with a dielectric cap layer 164, such as a silicon nitride material, a silicon dioxide material, or any combination thereof. Moreover, a spacer element or spacer structure 165 may be provided so as to confine, in combination with the dielectric cap layer 164, the sensitive gate materials 163, 162 and 161.

Similarly, the transistor 150A may comprise a gate electrode structure 160A, which may have basically the same configuration as the gate electrode structure 160B, wherein, however, due to any pattern non-uniformities, certain differences may exist, while also the material layers 161 and 162 may provide the desired threshold voltage for the transistor 150A, which may require the incorporation of appropriate metal species and the like.

The semiconductor device 100 as illustrated in FIG. 1a may be formed on the basis of the following processes. After providing the isolation structure 102I using well-established lithography, etch, deposition and planarization techniques, the basic well dopant species may be incorporated into the active regions 102A, 102B, which have been laterally delineated by providing the isolation structure 102I. To this end, any well-established implantation techniques and masking regimes may be applied. Thereafter, if required, the threshold adjusting semiconductor material 102C may be formed selectively in the active region 102B, followed by a complex deposition and patterning sequence for forming an appropriate gate layer stack and patterning the same so as to obtain the gate electrode structures 160A, 160B. For this purpose, appropriate materials for the gate dielectric material, possibly including a high-k material, as discussed above, and for the metal-containing electrode materials 162 may be applied, thereby also providing appropriate metal species in order to adjust the work functions for the gate electrode structures 160A, 160B differently in accordance with the corresponding transistor requirements. Next, the material 163 and the one or more materials of the dielectric cap layer 164 are provided, possibly in combination with additional sacrificial materials, as are required for patterning the resulting gate stack, which may involve one or more lithography steps and corresponding etch processes. Thereafter, the spacer structure 165 may be formed by using well-established low pressure chemical vapor deposition (CVD), multi-layer deposition recipes and the like. After patterning the resulting layer stack, a further spacer layer may be provided and may be patterned so as to cover the active region 102A, while forming appropriate spacers on sidewalls of the gate electrode structures 160B. Thereafter, cavities may be formed in the active region 102B and the material 102F may be formed on the basis of selective epitaxial growth techniques. Thereafter, the spacer layer may be patterned into the spacer structure 165 for the gate electrode structure 160A, while in other cases the corresponding spacer layer may be removed together with any additional spacer element provided on sidewalls of the gate electrode structure 160B, depending on the overall process strategy. It should be appreciated that, in other cases, the additional process steps for implementing the strain-inducing semiconductor material 102F may be omitted if a corresponding strain-inducing mechanism is not required. In some illustrative embodiments, as illustrated by the dashed lines, a sacrificial spacer structure or element 105 may be provided so as to act as a protective structure for the spacer 165, since typically the spacer structure 165 may be formed of a similar material as the dielectric cap layer 164, which may have to be removed during the further processing. In this manner, the sacrificial spacer 105 may act as an efficient etch mask. To this end, any well-established process techniques may be applied, for instance, depositing a silicon dioxide material or any other appropriate dielectric material having the required etch resistivity with respect to an etch chemistry that is appropriately selected in order to remove the dielectric cap layer 164. For example, amorphous carbon may also be efficiently used as material for the sacrificial spacer structure 105. During the deposition and the subsequent patterning of the sacrificial spacer element 105, process parameters are selected so as to obtain a spacer width that is appropriate for incorporating drain and source dopant species into the active region 102A, while a corresponding incorporation of drain and source dopant species into the active region 102B may be performed in a later manufacturing stage.

Figure 1B:
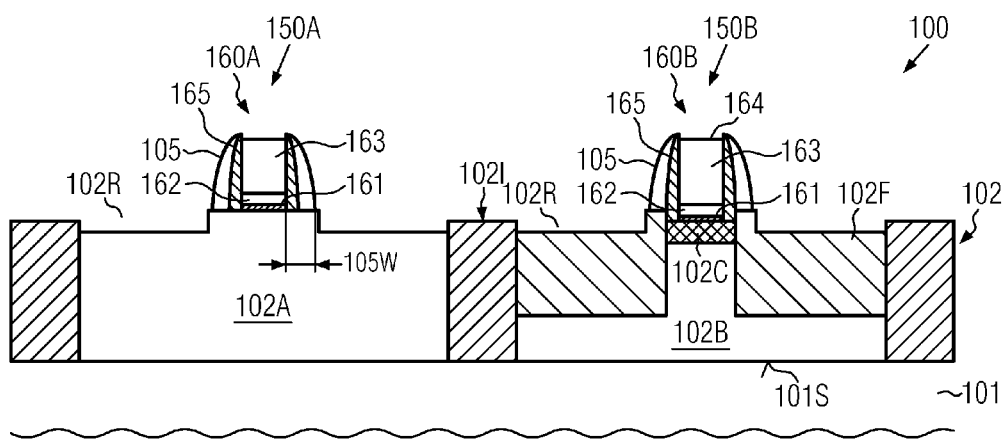

FIG. 1b schematically illustrates the semiconductor device 100 in a further advanced manufacturing stage according to some illustrative embodiments. In these embodiments, the dielectric cap layer 164 (FIG. 1a) is removed on the basis of any appropriate etch strategy, for instance by using plasma-based etch recipes, wet chemical etch recipes and the like. As discussed above, during the corresponding removal process, the sacrificial spacer structure 105, which, together with the spacer structure 165 has a width 105W, may act as an etch mask in order to avoid undue material removal of the spacer structure 165, which in turn may act as a reliable protective material during the further processing of the device 100 in view of sensitive gate materials, such as the materials 161 and 162. During the corresponding removal process, also a certain amount of material may be removed from the active regions 102A, 102B, as indicated by the corresponding recesses 102R.

Figure 1C:
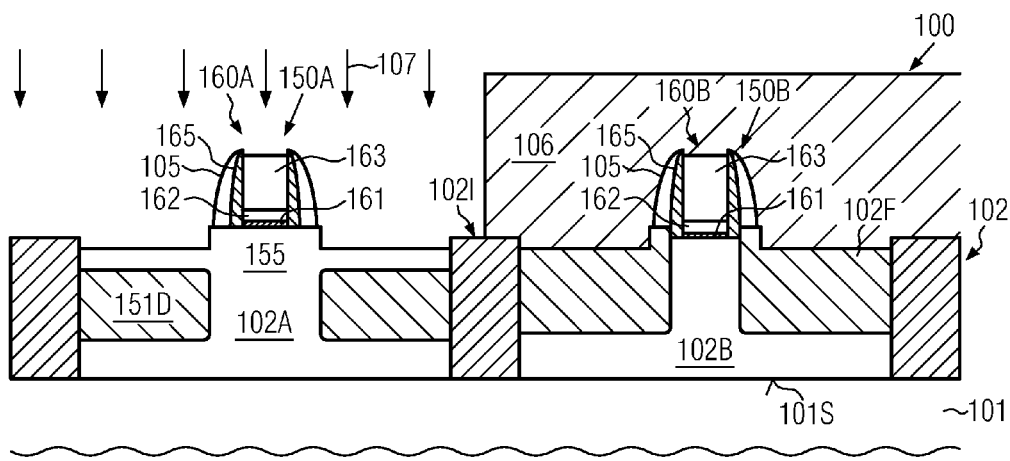

FIG. 1c schematically illustrates the semiconductor device 100 in a further advanced manufacturing stage. As illustrated, an implantation mask 106, such as a resist mask, is provided above the active region 102B and the gate electrode structure 160B. On the other hand, the active region 102A is exposed to an ion implantation process 107, whose process parameters are selected so as to incorporate the dopant species for forming deep drain and source regions 151D of the transistor 150A. In some illustrative embodiments, an N-type dopant species may be incorporated during the process 107, wherein the spacer structure 105 in combination with the gate electrode structure 160A may act as an implantation mask. Thus, the spacer structure 105 may essentially determine a lateral offset of the deep drain and source regions 151D with respect to the channel region 155 of the transistor 150A. For example, as explained above, the lateral offset obtained by the spacer structure 105 may be less than a lateral offset that may be required during the further processing of the device 100, when incorporating a dopant species for deep drain and source regions for the transistor 150B, for instance when a corresponding imbalance in the spacer width may be caused throughout the complex process sequence for forming sophisticated N-channel transistors and P-channel transistors, as discussed above.

In other illustrative embodiments, the lateral offset defined by the spacer structure 105 may be greater compared to a lateral offset required for the transistor 150B in a later manufacturing stage. For example, if the dopant species incorporated during the implantation process 107 may require an increased lateral offset, for instance due to a greater diffusion activity, a corresponding increased lateral offset may be implemented by means of the structure 105. For example, if the transistor 150A may represent a P-channel transistor, which may require an increased offset due to the superior diffusion activity of boron, a corresponding offset may be adjusted, while in a later phase the spacer width used for adjusting the lateral dopant profile of the transistor 150B may be selected less compared to the width of the spacer structure 105.

In still other illustrative embodiments, the implantation process 107 may be performed in an earlier manufacturing stage, for instance in a manufacturing stage as shown in FIG. 1a after providing the sacrificial spacer structure 105 and prior to removing the dielectric cap layer 164 (FIG. 1a). In this case, also the dielectric cap layer 164 may act as an efficient implantation mask, which may be considered appropriate in some illustrative embodiments, thereby avoiding undue incorporation of dopant species in the channel region 155 for a given height of the gate electrode structure 160A. In this case, the dielectric cap layer 164 of FIG. 1a may then be removed after the implantation process 107, as is described with reference to FIG. 1b.

Figure 1D:
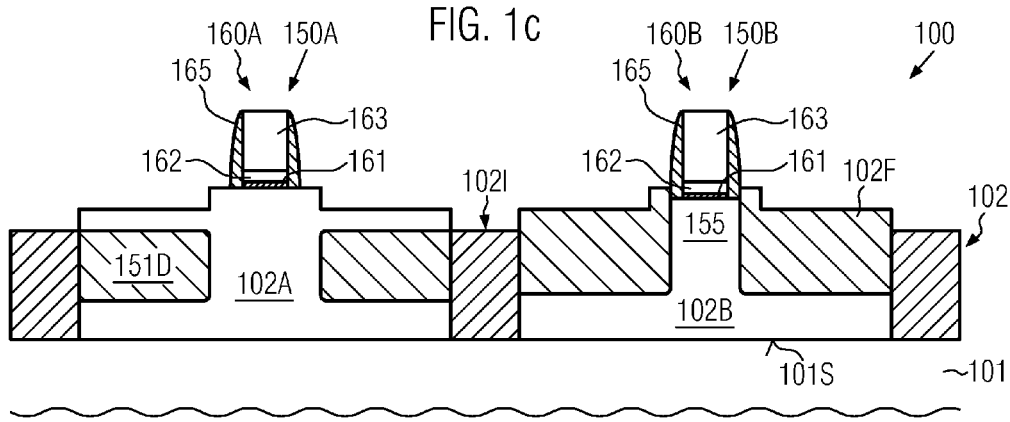

FIG. 1d schematically illustrates the semiconductor device 100 in a further advanced manufacturing stage, i.e., after the removal of the implantation mask 106 and after the removal of the sacrificial spacer structure 105 (FIG. 1c). Consequently, in this manufacturing stage, the spacer structure 165 or any other appropriate spacer structure having reduced lateral dimensions may be used, together with the gate electrode structures 160A, 160B, as implementation masks for forming shallow drain and source extensions regions and any counter-doped regions or halo regions, which typically require a reduced lateral offset with respect to the electrode material of the gate electrode structures 160A, 160B in order to actually determine a channel length in the channel region 155. The removal of the implantation mask 106 and of the spacer structure 105 (FIG. 1c) may be accomplished by any well-established process strategies, such as oxygen plasma, wet chemical resist strip processes, in combination with selective etch recipes for removing silicon dioxide material, amorphous carbon material and the like, depending on the material composition of the sacrificial spacer structure 105.

Figure 1E:
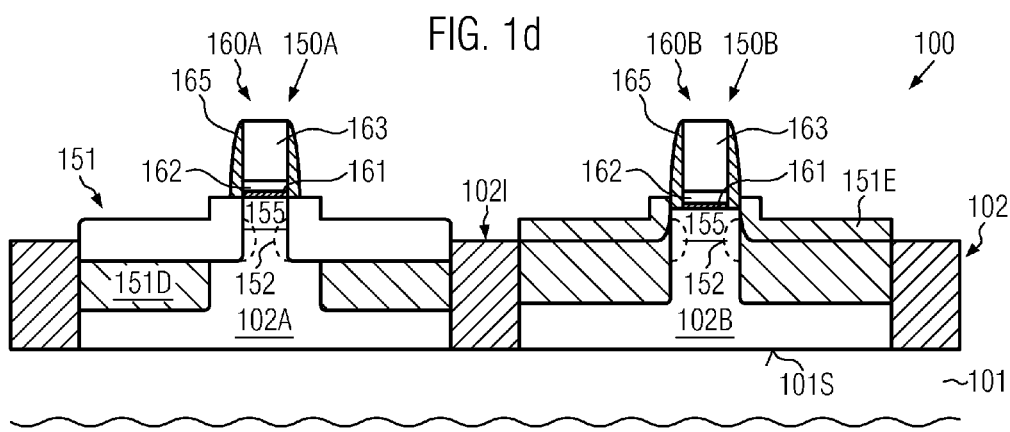

FIG. 1e schematically illustrates the semiconductor device 100 in a further advanced manufacturing stage. As illustrated, drain and source regions 151 are formed in the active region 102A and comprise the deep drain and source regions 151D, previously formed on the basis of the spacer structure 105 and the implantation process 107 (FIG. 1c), and drain and source extension regions 151E, which may represent highly doped yet very shallow dopant profiles. As indicated, since the extension regions 151E may be formed on the basis of the spacer structure 165, the lateral offset from the channel region 155 may be less compared to the deep drain and source regions 151D. Moreover, in the manufacturing stage shown, also counter-doped regions or halo regions 152 may be provided at an appropriate depth and with a desired lateral offset as defined by the overall transistor characteristics of the transistor 150A. Similarly, drain and source extension regions 151E may be formed in the active region 102B so as to comply with the requirements of the transistor 150B. Moreover, corresponding counter-doped or halo regions 152 may be provided for the transistor 150B. It should be appreciated that if the transistors 150A, 150B represent complementary transistors, the corresponding dopings of the drain and source extension regions 151E may be inverse for the transistors 150A, 150B, likewise the doping of the halo regions 152 may be inverse for the transistors 150A, 150B.

The corresponding drain and source extension regions 151E and the corresponding halo regions 152 may be formed on the basis of any appropriate implantation sequences in combination with an appropriate masking regime so as to alternately cover the transistors 150A, 150B in order to incorporate the appropriate dopant species in the corresponding non-masked transistor.

Figure 1F:
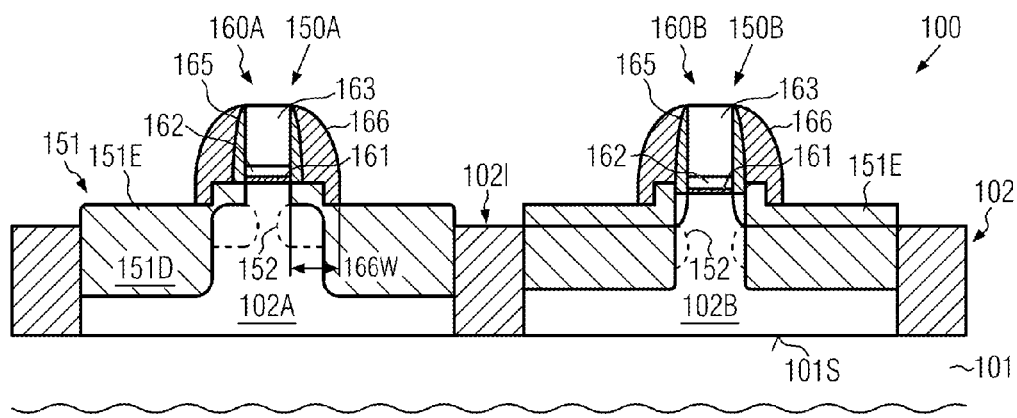

FIG. 1f schematically illustrates the semiconductor device 100 in a further advanced manufacturing stage. As illustrated, a spacer element or spacer structure 166 may be provided at sidewalls of the gate electrode structures 160A, 160B, wherein the spacer or spacer structure 166 may have an appropriate spacer width 166W that, in combination with the spacer structure 165, may provide a desired lateral offset for forming deep drain and source areas in the active region 102B so as to comply with the corresponding transistor characteristics. For example, in the embodiment shown in FIG. 1f, it may be assumed that an increased spacer width 166W may be required compared to the width of the spacer structure 105 as used during the implantation process 107 (FIG. 1c). A corresponding increased spacer width may be required due to an increased diffusion activity of a corresponding dopant species, as is also described above. Consequently, during a corresponding manufacturing strategy for providing the spacer or spacer structure 166, the initial layer thickness of the spacer material and the etch process parameters may be appropriately selected so as to obtain the required spacer width 166W. To this end, any well-established process techniques may be applied. Thus, an individual adjustment with respect to the requirements of the transistor 150B may be accomplished for the subsequent implantation process when incorporating a further drain and source dopant species into the active region 102B, while on the other hand the lateral dopant profile of the deep drain and source regions 151D of the transistor 150A have been adjusted on the basis of the spacer structure 105, as shown in FIG. 1c.

Figure 1G:
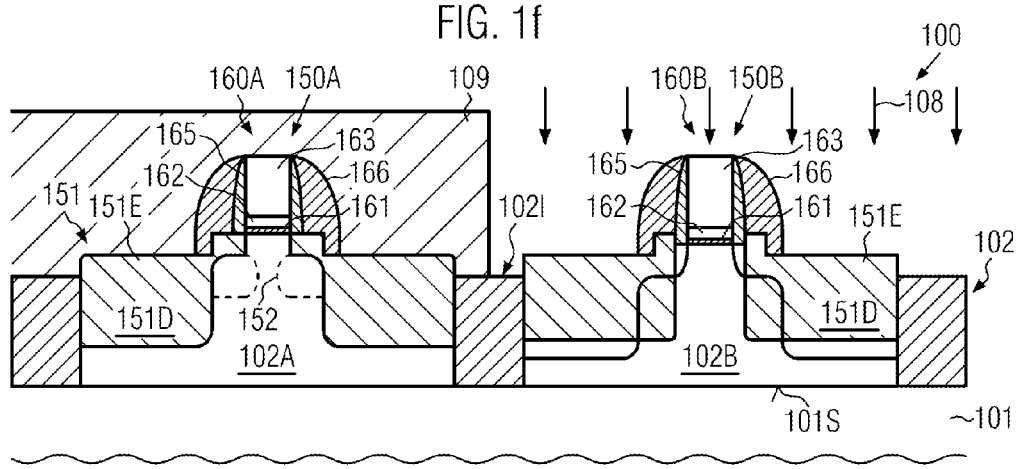

FIG. 1g schematically illustrates the semiconductor device 100 in a manufacturing stage in which the transistor 150A may be covered by an implantation mask 109, such as a resist material, while the transistor 150B is exposed to an implantation process 108 in which an appropriate dopant species may be incorporated into the active region 102B in order to form deep drain and source regions 151D therein. Thus, during the implantation process 108, the gate electrode structure 160B in combination with the spacer structure 166 having the desired spacer width act as an implantation mask for defining the desired lateral offset of the regions 151D. In some illustrative embodiments, a P-type dopant species may be incorporated during the process 108, which may typically require an increased spacer width, as is also described above. In other cases, however, an N-type dopant species may be incorporated, wherein the spacer width 166W may be appropriately adapted. For example, also a reduced spacer width compared to the spacer structure 105 of FIG. 1c may be used, if required for obtaining a desired profile of the regions 151D in the active region 102B. For example, in this case, the transistor 150A may represent a P-channel transistor and a P-type dopant species may have been incorporated during the implantation process 107 of FIG. 1c on the basis of an appropriate lateral offset, while during the implantation 108, an N-type dopant species may be incorporated, for instance on the basis of a reduced lateral offset.

Thereafter, the final configuration of the drain and source regions 151 for the transistors 150A, 150B may be adjusted by performing one or more anneal processes in accordance with appropriately selected process parameters, wherein a certain degree of dopant diffusion may be induced, which in turn may result in the desired final vertical and lateral dopant profile. As discussed above, since at least the deep drain and source regions 151D of the transistors 150A, 150B have been adjusted on the basis of individually selected spacer width and thus lateral offsets, also an individual adjustment of the final profile of the drain and source regions may be accomplished on the basis of a common anneal process.

Figure 1H:
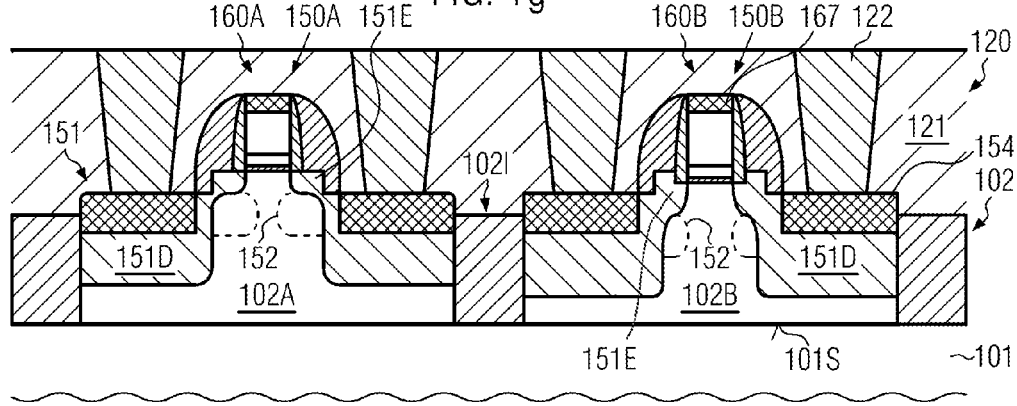

FIG. 1h schematically illustrates the semiconductor device 100 in a further advanced manufacturing stage. As illustrated, the final lateral and vertical profile of the drain and source regions 151 of the transistors 150A, 150B may be provided in order to comply with the transistor requirements. For example, in the embodiment shown, the deep drain and source regions 151D may extend down to the interface 101S, which in some illustrative embodiments may represent a dielectric barrier, for instance when considering an SOI architecture. Moreover, the lateral profile of the deep drain and source regions as well as the overall concentration may also correspond to the device requirements of the transistors 150A, 150B. Moreover, as illustrated, metal/semiconductor compounds 154 may be provided in the drain and source regions 151, while in some illustrative embodiments also a metal/semiconductor compound 167 may be provided in the gate electrode structures 160A, 160B. Furthermore, a contact level 120, for instance comprising one or more dielectric materials 121, such as silicon nitride, silicon dioxide and the like, may be provided so as to enclose and thus passivate the transistors 150A, 150B. Moreover, the contact level 120 may comprise a plurality of contact elements 122, which may connect to the corresponding contact regions of the transistors 150A, 150B, such as the drain and source regions 151. For example, the contact elements 122 may connect to the metal/semiconductor compound 154.

The semiconductor device 100 as shown in FIG. 1h may be formed on the basis of any well-established and appropriate process strategy. For example, after any anneal processes for activating the dopant species and inducing a certain degree of dopant diffusion for adjusting the final profile of the drain and source regions 151, and also of the halo regions 152, the metal/semiconductor compounds 154, possibly in combination with the compounds 167, may be formed in accordance with well-established process techniques, such as silicidation regimes and the like. Thereafter, the one or more materials of the dielectric material or material system 121 may be deposited and planarized, followed by the patterning of these materials in order to form respective openings, which may subsequently be filled with any appropriate contact metal, such as tungsten and the like, depending on the overall process and device requirements.

In other illustrative embodiments (not shown), the semiconductor device 100 may be formed, starting from the device configuration as shown in FIG. 1c, by increasing the width of the spacer structure 105, after forming the deep drain and source regions 151D in the active region 102A, so as to comply with the requirements of an increased spacer width for incorporating the deep drain and source regions in the active region 102B in a later manufacturing stage. To this end, an additional spacer layer may be deposited, such as a silicon nitride material, a silicon dioxide material and the like, which may then be patterned without removing the spacer structure 105. In this case, the drain and source extension regions 151E and the halo regions 152 of the transistors 150A, 150B (FIG. 1e) may be formed in an earlier manufacturing stage, i.e., prior to forming the spacer structure 105 and thus prior to removing the dielectric cap layer 165 (FIG. 1a). Consequently, in these embodiments, the spacer structure 105 of FIG. 1c may be used as a permanent spacer structure, the width of which may be adapted during the further processing in order to comply with the implantation requirements for the transistor 150B in a later manufacturing stage.

As a result, the present disclosure provides manufacturing techniques and semiconductor devices in which a spacer structure may be advantageously used as an etch mask for removing a dielectric cap material of sophisticated gate electrode structures, wherein the width of the spacer structure is selected so as to comply with the implantation requirements for forming deep drain and source areas of one type of transistor. Thereafter, the width of the spacer structure may be adapted, or the spacer structure may be replaced by a further spacer structure, the width of which may be appropriately adapted for complying with the implantation requirements for forming deep drain and source regions of the other type of transistor. Consequently, in some illustrative embodiments, an individual adjustment of the lateral profile of the deep drain and source regions of different types of transistor may be accomplished without requiring any additional process steps.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A method, comprising:
forming a first gate electrode structure above a first active region and a second gate electrode structure above a second active region, said first and second gate electrode structures comprising a dielectric cap layer;
forming a sacrificial spacer adjacent to sidewalls of said first and second gate electrode structures;

removing said dielectric cap layer from each of said first and second gate electrode structures in the presence of said sacrificial spacer;

after removing said dielectric cap layers, forming deep drain and source regions selectively in said first active region by using said sacrificial spacer as an implantation mask;

removing said sacrificial spacer from said first and second gate electrode structures; and forming deep drain and source regions selectively in said second active region after removal of said sacrificial spacer.

2. The method of claim 1, further comprising forming drain and source extension regions in said first and second active regions after removal of said sacrificial spacer.

3. The method of claim 1, further comprising forming drain and source extension regions in said first and second active regions prior to forming said sacrificial spacer.

4. The method of claim 1, wherein forming said deep drain and source regions selectively in said second active region comprises forming a spacer adjacent to said sidewalls of at least said second gate electrode structure and using said spacer as an implantation mask.

5. The method of claim 1, wherein forming said first and second gate electrode structures comprises incorporating a high-k dielectric material in a gate dielectric layer of said first and second gate electrode structures.

6. The method of claim 5, wherein forming said first and second gate electrode structures further comprises providing a metal-containing electrode material and a semiconductor material above said gate dielectric layer.

7. The method of claim 5, further comprising forming threshold adjusting semiconductor material on said second active region prior to forming said first and second gate electrode structures.

8. The method of claim 5, further comprising forming a metal/semiconductor compound in said first and second gate electrode structures.

9. The method of claim 1, further comprising forming a strain-inducing semiconductor alloy in said second active region.

10. The method of claim 1, further comprising forming an N-channel transistor from said first gate electrode structure and said first active region and forming a P-channel transistor from said second gate electrode structure and said second active region.

11. The method of claim 1, further comprising forming a first spacer adjacent to said sidewalls of said first and second gate electrode structures prior to forming said sacrificial spacer.

12. The method of claim 11, wherein forming said deep drain and source regions selectively in said second active region comprises forming a second spacer adjacent to said first spacer of said second gate electrode structure and using said second spacer as an implantation mask.

13. A method of forming transistors of a semiconductor device, the method comprising:

forming a first gate electrode structure on a first active region and forming a second gate electrode structure on a second active region, at least one of said first and second gate electrode structures comprising a gate dielectric layer including a high-k dielectric material;

forming a sacrificial spacer adjacent to sidewalls of said first and second gate electrode structures;

removing a dielectric cap layer from said first and second gate electrode structures by using said sacrificial spacer as an etch mask;

after removing said dielectric cap layer, forming first deep drain and source regions selectively in said first active region by using said sacrificial spacer as an implantation mask;

removing said sacrificial spacer from said first and second gate electrode structures; and forming second deep drain and source regions selectively in said second active region by using a spacer element formed adjacent to sidewalls of said first and second gate electrode structures after removal of said sacrificial spacer.

14. The method of claim 13, further comprising forming drain and source extension regions in said first and second active regions prior to removing said sacrificial spacer.

15. The method of claim 13, further comprising forming drain and source extension regions in said first and second active regions after removal of said sacrificial spacer.

16. The method of claim 15, wherein forming second deep drain and source regions comprises forming said spacer with a width that is greater than a width of said sacrificial spacer.

17. The method of claim 13, further comprising forming a metal/semiconductor compound in said first and second gate electrode structures after removal of said dielectric cap layer.

18. The method of claim 13, further comprising forming a spacer structure adjacent to said sidewalls of said first and second gate electrode structures prior to forming said sacrificial spacer, wherein said spacer element is formed on said spacer structure after removing said sacrificial spacer.

19. A method of forming a semiconductor device, the method comprising:

forming a first gate electrode structure above a first active region and a second gate electrode structure above a second active region, said first and second gate electrode structures comprising a high-k gate dielectric material and a dielectric cap layer;

forming a first spacer structure adjacent to sidewalls of said first and second gate electrode structures;

removing said dielectric cap layer from said first and second gate electrode structures by using said first spacer structure as an etch mask;

forming first deep drain and source regions in said first active region in the presence of said first spacer structure, wherein an outer sidewall surface of said first spacer structure formed adjacent to said first gate electrode structure is directly exposed to an implantation process that is used to form said first deep drain and source regions; and forming second deep drain and source regions in said second active region by using a second spacer structure.

20. The method of claim 19, wherein forming said second deep drain and source regions comprises removing said first spacer structure and forming said second spacer structure after removal of said first spacer structure.

21. The method of claim 19, wherein forming said second deep drain and source regions comprises increasing a width of said first spacer structure so as to provide said second spacer structure.

22. The method of claim 19, further comprising forming drain and source extension regions in said first and second active region after forming said first deep drain and source regions.

23. The method of claim 19, wherein said first deep drain and source regions are formed after removing said dielectric cap layers.

24. A method of forming a semiconductor device, the method comprising:

forming a first gate electrode structure above a first active region and a second gate electrode structure above a second active region, said first and second gate electrode structures comprising a high-k gate dielectric material and a dielectric cap layer;

forming a first spacer structure on sidewalls of said first and second gate electrode structures;

removing said dielectric cap layer from said first and second gate electrode structures by using said first spacer structure as an etch mask;

forming first deep drain and source regions in said first active region in the presence of said first spacer structure; and forming second deep drain and source regions in said second active region by using a second spacer structure, wherein forming said second deep drain and source regions comprises removing said first spacer structure and forming said second spacer structure after removal of said first spacer structure.

* * * * *